(12) United States Patent
Chang et al.

(10) Patent No.: US 9,300,507 B2
(45) Date of Patent: Mar. 29, 2016

(54) LOCAL OSCILLATION GENERATOR AND ASSOCIATED COMMUNICATION SYSTEM AND METHOD FOR LOCAL OSCILLATION GENERATION

(71) Applicant: MStar Semiconductor, Inc., Hsinchu Hsien (TW)

(72) Inventors: Keng-Meng Chang, Hsinchu County (TW); Yao-Chi Wang, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 187 days.

(21) Appl. No.: 13/940,416

(22) Filed: Jul. 12, 2013

(65) Prior Publication Data
US 2014/0029690 A1  Jan. 30, 2014

(30) Foreign Application Priority Data

Jul. 24, 2012  (TW) .............................. 101126655 A

(51) Int. Cl.
*H04L 27/12* (2006.01)
*H03C 3/09* (2006.01)
*H03F 1/26* (2006.01)

(52) U.S. Cl.
CPC ............ *H04L 27/127* (2013.01); *H03C 3/0908* (2013.01); *H03F 1/26* (2013.01); *H03F 2200/114* (2013.01)

(58) Field of Classification Search
CPC .. H03L 27/127; H04L 27/127; H03C 3/0908; H03F 1/26
USPC .................................. 327/113, 298; 331/2, 46
See application file for complete search history.

(56) References Cited

U.S. PATENT DOCUMENTS

| | | | | |
|---|---|---|---|---|
| 4,528,522 A | * | 7/1985 | Matsuura | 331/2 |
| 6,324,385 B1 | * | 11/2001 | Nagano et al. | 455/76 |
| 6,828,863 B2 | * | 12/2004 | Itkin et al. | 331/2 |
| 2006/0094374 A1 | | 5/2006 | Olip | |
| 2009/0286490 A1 | * | 11/2009 | Chung | 455/75 |
| 2013/0069699 A1 | * | 3/2013 | Szilagyi | 327/156 |
| 2013/0307605 A1 | * | 11/2013 | Patrizi | 327/298 |

OTHER PUBLICATIONS

Taiwan Intellectual Property Office, "Office Action," Mar. 25, 2015.

* cited by examiner

*Primary Examiner* — Jeffrey Shin
(74) *Attorney, Agent, or Firm* — WPAT, PC; Justin King

(57) ABSTRACT

A local oscillation generator includes an oscillation circuit, a frequency multiplication circuit, a mixer, and a frequency divider. The oscillation circuit provides a fundamental oscillation signal. The frequency multiplication circuit provides a first oscillation signal according to the fundamental oscillation signal. The mixer provides a mixed oscillation signal according to mixing of the fundamental oscillation signal and the first oscillation signal. The frequency divider frequency divides the mixed oscillation signal so that the local oscillation generator accordingly provides a local oscillation signal.

30 Claims, 6 Drawing Sheets

LOCAL OSCILLATION GENERATOR AND ASSOCIATED COMMUNICATION SYSTEM AND METHOD FOR LOCAL OSCILLATION GENERATION

This application claims the benefit of Taiwan application Serial No. 101126655, filed Jul. 24, 2012, the subject matter of which is incorporated herein by reference.

BACKGROUND OF THE INVENTION

1. Field of the Invention

The invention relates in general to a local oscillation generator for a communication system, and more particularly, to a local oscillation generator capable of preventing an amplifier from interfering with a local oscillation circuit in a communication system.

2. Description of the Related Art

Communication networks of various standards including WLAN, Bluetooth, mobile communications, satellite positioning, and digital televisions constitute an essential part of the modern information society. A communication network includes a transmitter and a receiver. To fully utilize communication channels as well as perform multiple accessing, the transmitter and the receiver respectively includes a local oscillation generator for generating local oscillation signals. For example, in a radio-frequency (RF) wireless communication network, a transmitter encodes information to be transmitted to the communication network to a baseband signal, and a local oscillation signal provided by a local oscillation generator at the transmitter serves as a modulation carrier. By mixing the baseband signal and the modulation carrier, the baseband is modulated and up-converted to an RF signal. A power amplifier at the transmitter further amplifies the power of the RF signal in order to transmit the RF signal to a communication network medium, e.g., the air. Correspondingly, after a receiver in the RF communication network receives the RF signal via the network communication medium, a local oscillation signal provided by a local oscillation generator serves as a demodulation carrier. By mixing the RF signal and the demodulation carrier, the RF signal is demodulated and down-converted to a baseband signal to restore the original information from the transmitter.

In a conventional local oscillation generator, an original oscillation signal is generated by an oscillation circuit, and the original frequency signal is frequency divided by an integral multiple to generate a local oscillation signal. For example, assuming that the local oscillation frequency required by the local oscillation signal is 2.4 GHz, a 4.8 GHz or 9.6 GHz original oscillation signal is first generated by an oscillation circuit of the conventional technique, and is then frequency divided by an integral multiple of 2 or 4 to obtain a 2.4 GHz local oscillation signal. Moreover, due to non-linearity of circuits in the transmitter or circuits in the receiver, the local oscillation signal induces harmonic multi-frequency oscillation signals containing frequencies in integral multiples of the local oscillation signal, e.g., 4.8 GHz or 9.6 GHz. However, in the above conventional technique, since the original oscillation frequency based on which the oscillation circuit operates is also an integral multiple of the local oscillation frequency, the harmonic multi-frequency oscillation signals interfere with the operations of the oscillation circuit to degrade the communication quality.

For example, in the transmitter, as the power amplifier amplifies the power of the RF signal, the non-linearity of the amplification process induces high-power harmonic multi-frequency oscillation signals. In the event that the original oscillation frequency of the oscillation circuit for providing the original oscillation signal is also an integral multiple of the local oscillation signal, the harmonic multi-frequency oscillation signals of the power amplifier imposes a frequency pulling effect on the oscillation circuit. As a result, an error vector magnitude of the transmitter is deteriorated to degrade the overall signal quality. Such an effect is quite severe in various 2G/3G/4G mobile communications networks and WLAN. A main reason for the above is that, in a transmitter of the above wireless networks, a power amplifier operates at a higher power such as 15 to 30 dBm (or 32 to 1000 mW).

SUMMARY OF THE INVENTION

The invention is directed to a novel technique for local oscillation generation, in which frequency multiplication and mixing are performed based on a fundamental frequency generated by an oscillation circuit, followed by performing frequency dividing to obtain a local oscillation frequency. Accordingly, the local oscillation frequency is a non-integral multiple of the fundamental frequency, and thus a harmonic multiple frequency derived from the local oscillation frequency is also a non-integer of the fundamental frequency, thereby effectively mitigating undesirable effects and interferences imposed by the local oscillation frequency on the oscillation circuit.

According to an object of the present invention, a local oscillation generator applied to a communication system to provide a local oscillation signal is provided. The local oscillation generator includes an oscillation circuit, a frequency multiplication circuit, a mixer, and a frequency divider. The oscillation circuit provides a fundamental oscillation signal associated with a fundamental frequency. The frequency multiplication circuit, coupled to the oscillation circuit, provides a first oscillation signal associated with a first frequency according to the fundamental oscillation signal. The mixer, coupled to the oscillation circuit and the frequency multiplication circuit, provides a mixed oscillation signal according to the fundamental oscillation signal and the first oscillation signal. The frequency divider, coupled to the mixer, frequency divides the mixed oscillation signal to provide a frequency divided signal.

The mixed oscillation signal is associated with a mixer frequency, and the frequency divided signal is associated with a divider frequency. The mixer frequency may be greater than the fundamental frequency, and greater than the first frequency. For example, the mixer frequency is a sum of M times of the fundamental frequency and the fundamental frequency, where M is a predetermined integer greater than or equal to 1.

In an embodiment, the oscillation circuit and the frequency multiplication circuit are integrated in an oscillator. The oscillation circuit provides the fundamental oscillation signal through differential nodes of the oscillator; the frequency multiplication circuit provides the first oscillation signal through a common mode node of the oscillator. That is, the first oscillation signal may be a multi-frequency harmonic of the fundamental frequency, and the first frequency is M times of the fundamental frequency, e.g., twice, (i.e., M=2). The mixer (frequency) provides the mixed oscillation signal according to (frequency) mixing of the fundamental oscillation frequency and the first oscillation frequency, such that the mixer frequency equals a sum of the fundamental frequency and the first frequency, i.e., (M+1) times of the fundamental frequency. With the frequency division performed by the frequency divider, the mixer frequency is N times of the divider frequency, and so the local oscillation frequency is (M+1)/N times of the fundamental frequency.

In an embodiment, the local oscillation generator further includes a second frequency multiplication circuit. The second frequency multiplication circuit, coupled between the oscillation circuit and the mixer, provides a second oscillation signal according to the fundamental oscillation signal. The first oscillation signal and the second oscillation signal are respectively associated with a first frequency and a second frequency. The mixer mixes the first oscillation signal and the second oscillation signal to provide a mixed oscillation signal, such that the mixer frequency is a sum of the first frequency and the second frequency.

In an embodiment, the frequency multiplication circuit and the second frequency multiplication circuit respectively render the first frequency to be M times of the fundamental frequency and the second frequency to be L times of the fundamental frequency. Thus, the mixer frequency is (L+M) times of the fundamental frequency. The frequency division performed by the frequency divider renders the mixer frequency to be N times of the divider frequency, and so the mixer frequency is (L+M)/N times of the fundamental frequency.

In an embodiment, the frequency multiplication circuit and the second frequency multiplication circuit respectively render the fundamental frequency to be M times of the first frequency and the second frequency to be L times of the fundamental frequency. Thus, the mixer frequency is (L+(1/M)) times of the fundamental frequency. The frequency division performed by the frequency divider renders the mixer frequency to be N times of the divider frequency, and so the mixer frequency is (L+(1/M))/N times of the fundamental frequency.

In an embodiment, the frequency multiplication circuit and the second frequency multiplication circuit respectively render the first frequency to be M times of the fundamental frequency and the fundamental frequency to be L times of the second frequency. Thus, the mixer frequency is (M+(1/L)) times of the fundamental frequency. The frequency division performed by the frequency divider renders the mixer frequency to be N times of the divider frequency, and so the mixer frequency is (M+(1/L))/N times of the fundamental frequency.

In an embodiment, the frequency multiplication circuit and the second frequency multiplication circuit respectively render the fundamental frequency to be M times of the first frequency and the fundamental frequency to be L times of the second frequency. Thus, the mixer frequency is ((1/M)+(1/L)) times of the fundamental frequency. The frequency division performed by the frequency divider renders the mixer frequency to be N times of the divider frequency, and so the mixer frequency is ((1/M)+(1/L))/N times of the fundamental frequency.

In an embodiment, the local oscillation generator further includes a filter. The filter, coupled to the frequency divider, performs band-pass filtering on the frequency divided signal. A pass band of the filter is associated with the frequency of the local oscillation signal. For example, the filter is an inductive-capacitive (LC) buffer.

In an embodiment, the mixer supports a band-pass filter function having a pass band associated with the mixer frequency.

According to another object of the present invention, a communication system is provided. The communication system includes a transmitter and/or a receiver. The above local oscillation generator of the present invention is applicable to the transmitter to provide a local oscillation signal. The transmitter further includes a second mixer and a power amplifier. The second mixer, coupled to the local oscillation generator, mixes a baseband signal and the local oscillation signal to provide an RF signal. The power amplifier, coupled to the second mixer, amplifies the RF signal.

In an embodiment, the local oscillation generator of the present invention is also applicable to a receiver to provide a local oscillation signal. The receiver further includes a low-noise amplifier, a third mixer, and a baseband amplifier. The low-noise amplifier amplifies an RF signal to generate an amplified RF signal. The third mixer, coupled to the local oscillation generator, mixes the amplified RF signal and the local oscillation signal to accordingly provide a baseband signal. The baseband amplifier, coupled to the third mixer, amplifies the baseband signal.

According to another object of the present invention, a method for local oscillation generation is provided. The method, applied to a communication system to provide a local oscillation signal, includes: generating a mixed oscillation signal according to a fundamental signal and a first oscillation signal, wherein the fundamental signal is associated with a fundamental frequency, the first oscillation signal is associated with a first frequency, the first frequency is a multiple of a first integer of the fundamental frequency, and the first integer is greater than 1; and frequency dividing the mixed oscillation signal to generate a frequency divided signal, wherein the frequency divided signal is associated with the local oscillation signal, the mixed oscillation signal is associated with a mixer frequency, the frequency divided signal is associated with a divider frequency, and the mixer frequency is a multiple of a second integer of the divider frequency.

According to yet another object of the present invention, a method for local oscillation generation is provided. The method, applied to a communication system to provide a local oscillation signal, includes: generating a first oscillation signal and a second oscillation signal according to a fundamental oscillation signal, wherein the fundamental oscillation signal is associated with a fundamental frequency, the first oscillation signal is associated with a first frequency, the first frequency is a first integer multiple of the fundamental frequency, the first integer is greater than 1, the second oscillation signal is associated with a second frequency, the second frequency is a second integer multiple of the fundamental frequency, and the second integer is greater than 1; mixing the first oscillation frequency and the second oscillation frequency to generate a mixed oscillation signal associated with a mixer frequency; and frequency dividing the mixed oscillation signal to generate a frequency divided signal associated with a divider frequency, wherein the mixer frequency is a third integer multiple of the divider frequency, and the frequency divided signal is associated with the local oscillation signal.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
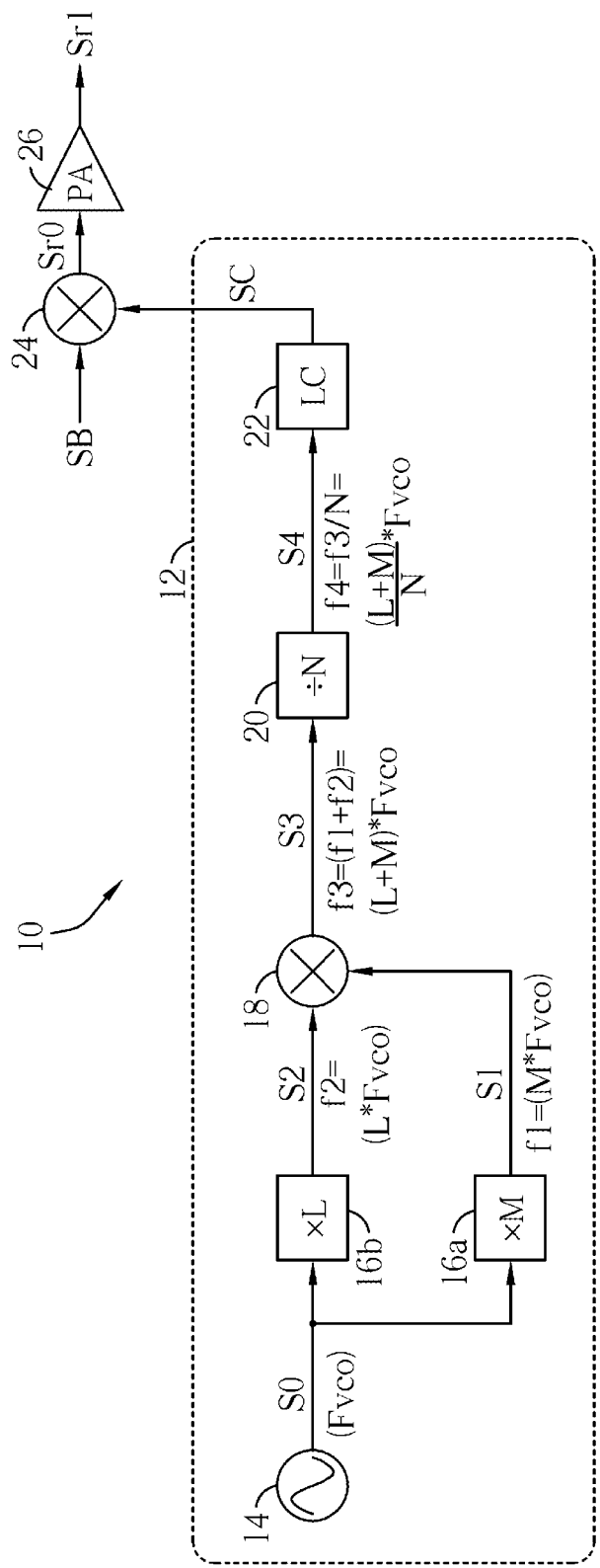
FIG. 1 is a schematic diagram of a local oscillation generator according to an embodiment of the present invention.

FIG. 1 shows a schematic diagram of a local oscillation generator 12 according to an embodiment of the present invention. The local oscillation generator 12 is applied to a communication system 10 to serve as a transmitter of a wireless communication network. The local oscillation generator 12 includes an oscillation circuit 14, two frequency multiplication circuits 16a and 16b, a mixer 18, a frequency divider 20, and a filter 22. With a mixer 24 and a power amplifier 26, the communication system 10 forms an analog front end of a network physical layer.

In the local oscillation generator 12, for example, the oscillation circuit 14 is a voltage-controller oscillator (VCO) of a phase locked loop (PLL, not shown), and provides a signal S0 as a fundamental oscillation signal having a frequency Fvco (regarded as a fundamental frequency). The frequency multiplication circuit 16a is coupled to the oscillation circuit 14, and multiplies the frequency of the signal S0 by M times to accordingly provide a signal S1 as a first oscillation signal. The signal S1 is associated with a frequency f1, which is M*Fvco, i.e., M times of the frequency Fvco. For example, the signal S1 may include a dominant harmonic having a frequency M*Fvco, or include or exclude other secondary harmonics having lower powers and frequencies as integral multiples of M*Fvco.

Similar to the frequency multiplication circuit 16a, the frequency multiplication circuit 16b is also coupled to the oscillation circuit 14, and multiplies the frequency of the signal S0 by L times to accordingly provide a signal S2 as a second oscillation signal. The signal S2 is associated with a frequency f2, which is L*Fvco. The predetermined integer L may be an integer not smaller than 1 so that the frequency f2 of the signal S2 is not less than the frequency Fvco.

In the local oscillation generator 12, the mixer 18 is coupled between the frequency multiplication circuits 16a and 16b and the frequency divider 20, and mixes the signals S1 and S2 to accordingly provide a corresponding mixed oscillation signal S3. The mixed oscillation signal S3 is associated with a frequency f3 (regarded as a mixer frequency), which is a sum of the frequencies f1 and f2, i.e., (L+M)*Fvco. For example, the mixed oscillation signal S3 may include a main component having a frequency f3, or other secondary components having different frequencies and lower powers. The divider 20 is coupled to the mixer 18, and frequency divides the signal S3 by an integer N to accordingly provide a corresponding frequency divided signal S4. The frequency divided signal S4 is associated with a frequency f4 (regarded as a divider frequency) equal to f3/N, i.e., ((L+M)/N)*Fvco. The integer N is an integer other than 1.

The filter 22 is coupled to the frequency divider 20, and performs band-pass filtering on the signal S4 to correspondingly provide a filtered signal SC, which serves as the local oscillation signal provided by the local oscillation generator 12. A pass band of the filter 22 is associated with the frequency of the signal SC, i.e., the frequency f4 of the signal S4, to remove other unnecessary components from the signal S4. For example, the filter 22 is an LC buffer having an LC resonance frequency designed to be the frequency f4. When the communication system 10 transmits a baseband signal SB, the mixer 24 coupled to the signals SC and SB mixes the signals SC and SB, and carries the signal SB to the frequency band of the frequency f4 using the signal SC as a carrier to generate a radio-frequency (RF) signal Sr0. The power amplifier 26 coupled to the mixer 24 amplifies the signal Sr0 to generate a signal Sr1, which is then transmitted to a network medium (not shown).

As seen from the above description, the power amplifier 26 operates at the frequency f4, i.e., ((L+M)/N)*Fvco, and the oscillation circuit 14 operates at the frequency Fvco. By appropriately setting values of the integers L, M, and N, to make every integral multiples of the frequency f4, ((L+M)/N)*Fvco, not equal to the frequency Fvco, multi-frequency harmonics (in multiple integers of the frequency f4) of the power amplifier 26 can be effectively prevented from interfering operations of the oscillation circuit 14. That is, making the frequency Fvco a non-integral multiple of the frequency f4, i.e., (N/(L+M)) is a non-integer. In an embodiment, it is apparent that, when (L+M)/N is greater than 1, such as when the integers M and N are equal such that the frequency f4 is greater than the frequency Fvco, the frequency pulling issue becomes substantially non-existent. Thus, the oscillation circuit 14 may operate at a lower frequency (lower than the local oscillation frequency f4) to also provide several advantages at the same time. For example, when the oscillation circuit 14 operates at a lower frequency, flexibility to trade-offs between the phase noise, tuning range, and power consumption of the oscillation circuit 14 increases. In another embodiment, when (L+M)/N is smaller than 1, given that (N/(L+M)) is a non-integer and integral multiples of the frequency f4 are not equal to the frequency Fvco, multi-frequency harmonics of the power amplifier 26 can still be effectively prevented from interfering operations of the oscillation circuit 14.

For example, assume that the communication system 10 operates under a network protocol of WLAN, the frequency f4 is 6 GHz, the frequency Fvco of the oscillation circuit 14 may be 14 GHz, and the integers L, M, and N may respectively be set as 1, 2, and 7. Accordingly, f4=(L+M)/N)*Fvco= (3/7)*Fvco=6 GHz. Therefore, harmonics having frequencies in integral multiples of the frequency f4 such as 12 GHz and 18 GHz harmonics do not match the frequency Fvco, and so the oscillation circuit 14 is avoided from the pulling effect of the power amplifier 26.

It should be noted that, the frequency multiplication circuit 16a may multiply the frequency of the fundamental oscillation signal S0 provided by the oscillation circuit (e.g., a VCO) by (1/M) times, which is substantially the same as dividing the frequency of the fundamental oscillation signal S0 by M. Similarly, the frequency multiplication circuit 16b may multiply the frequency of the fundamental oscillation signal S0 provided by the oscillation circuit by (1/L) times, which is substantially the same as dividing the frequency of the fundamental oscillation signal S0 by L. In an embodiment, when the frequency multiplication circuit 16a multiplies the frequency of the fundamental oscillation signal by (1/M) times, and the frequency multiplication circuit 16b multiplies the frequency of the fundamental oscillation signal S0 by L times, the divider frequency f4 is then ((L+(1/M))/N)*Fvco. In other words, to avoid frequency pulling, the condition of (N/(L+(1/M))) being a non-integer should be satisfied. In another embodiment, when the multiplication circuit 16a multiplies the frequency of the fundamental oscillation signal by (1/M) times, and the frequency multiplication circuit 16b multiplies the frequency of the fundamental oscillation signal S0 by (1/L) times, the divider frequency f4 is then (((1/L)+ (1/M))/N)*Fvco. To avoid frequency pulling, the condition of (N/((1/L)+(1/M))/N))) being a non-integer should be satisfied. Other situations can be similarly inferred.

Figure 2:
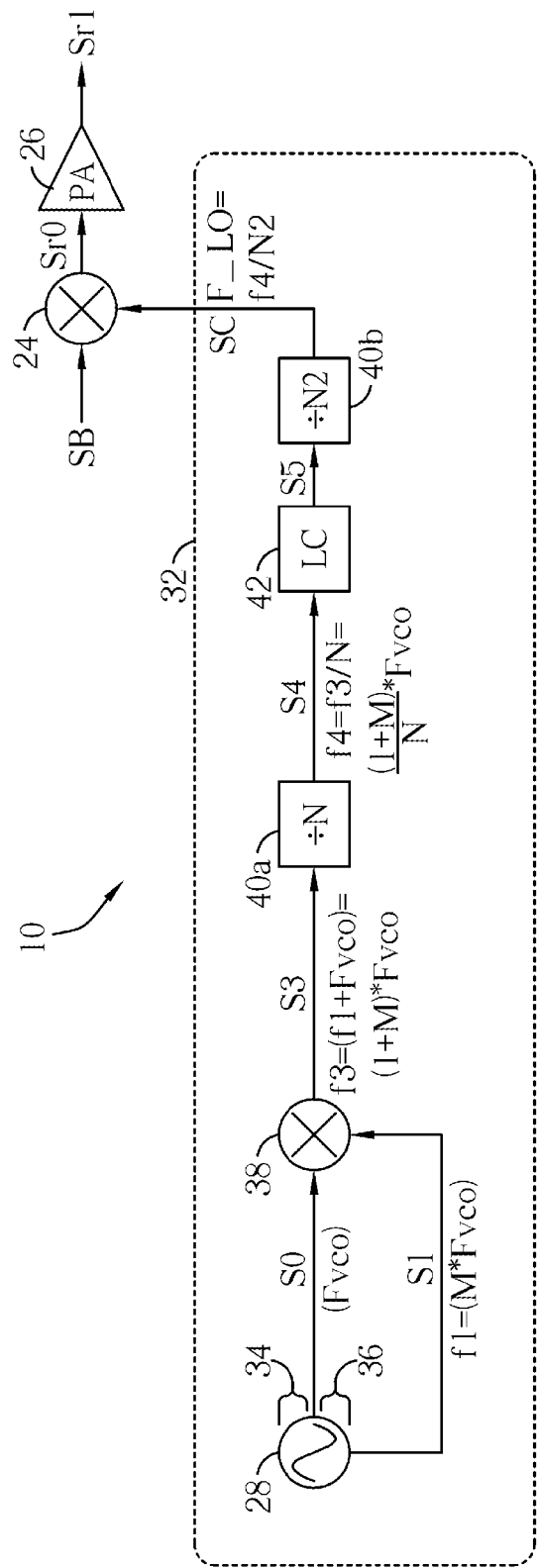
FIG. 2 is a schematic diagram of a local oscillation generator according to another embodiment of the present invention.

FIG. 2 shows a schematic diagram of a local oscillation generator 32 also applicable to the communication system 10 according to an embodiment of the present invention. The local oscillation generator 32 includes an oscillation circuit 34, a frequency multiplication circuit 36, a mixer 38, frequency dividers 40a and 40b, and a filter 42.

In the local oscillation generator 32, the oscillation circuit 34 and the frequency multiplication circuit 36 are integrated in an oscillator 28, e.g., a VCO in a PLL. The oscillation circuit 34 provides a fundamental oscillation signal S0 having a frequency Fvco by differential nodes of the oscillator 28. The frequency multiplication circuit 36 provides a signal S1 by a common mode node of the oscillator 28. The signal S1 is associated with a frequency f1, which is M*Fvco, i.e., M times of the frequency Fvco. The predetermined integer M may be greater than 1, so that the frequency f1 of the signal S1 is not less than the frequency Fvco. For example, the integer M may be a numerical value 2.

The mixer 38 is coupled to the oscillator 28, and mixes the signals S0 and S1 to accordingly provide a corresponding signal S3. The signal S3 is a mixed oscillation signal associated with a frequency f3, which is a sum of the frequency Fvco and the frequency f1, i.e., (1+M)*Fvco. The frequency divider 40a is coupled to the mixer 38, and frequency divides the signal S3 by an integer N to accordingly provide a corresponding signal S4. The signal S4 is associated with a frequency f4, which is equal to f3/N, i.e., ((1+M)/N)*Fvco. The integer N is a non-integral multiple of (1+M).

The filter 42 is coupled to the frequency divider 40a, and performs band-pass filtering on the signal S4 to correspondingly provide a filtered signal S5. A pass band of the filter 22 is associated with the frequency f4 of the signal S4 to remove other irrelevant components from the signal S4, such that the signal S5 becomes an oscillation signal having the frequency f4. In an embodiment, the filter 22 may be an LC buffer.

The frequency divider 40b is coupled to the filter 42, and frequency divides the signal S5 by an integer N2 to provide a signal SC as a local oscillation signal. A frequency F_LO of the signal SC is f4/N2, i.e., ((M+1)/(N*N2))*Fvco. The integer N2 may be an integer equal to or different from the integer N. In an embodiment, the integers N and N2 are both equal to 2.

By appropriately selecting the integers M, N, and N2, the fundamental frequency Fvco can be a non-integral multiple of the rendered frequency F_LO, so as to suppress the interference imposed by the power amplifier 26 on the oscillator 28. Further, by rendering the frequency F_LO to be greater than the frequency Fvco, the oscillator 28 is allowed to operate at a lower frequency (lower than the frequency F_LO).

Figure 3:
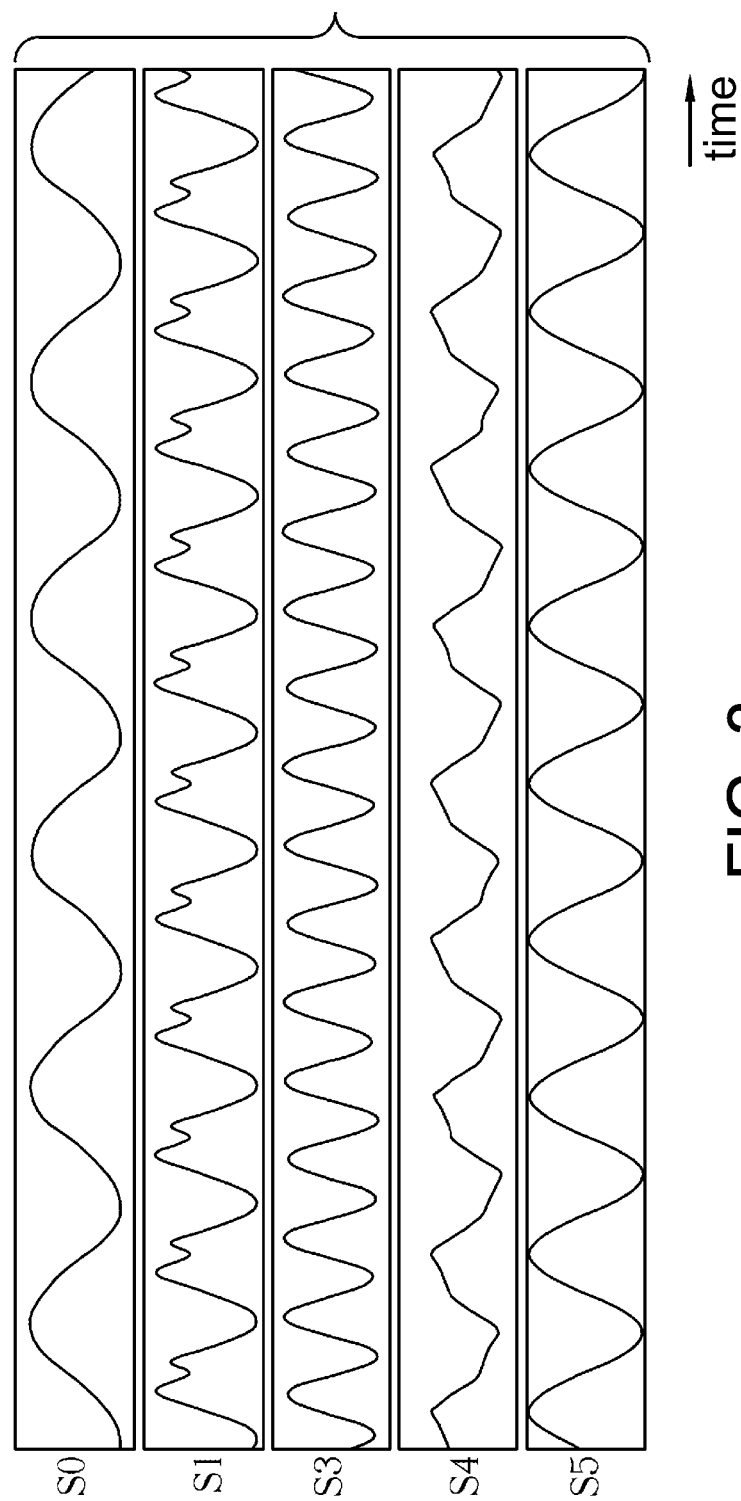
FIG. 3 is an exemplary waveform diagram of associated signals in FIG. 2.
Figure 4:
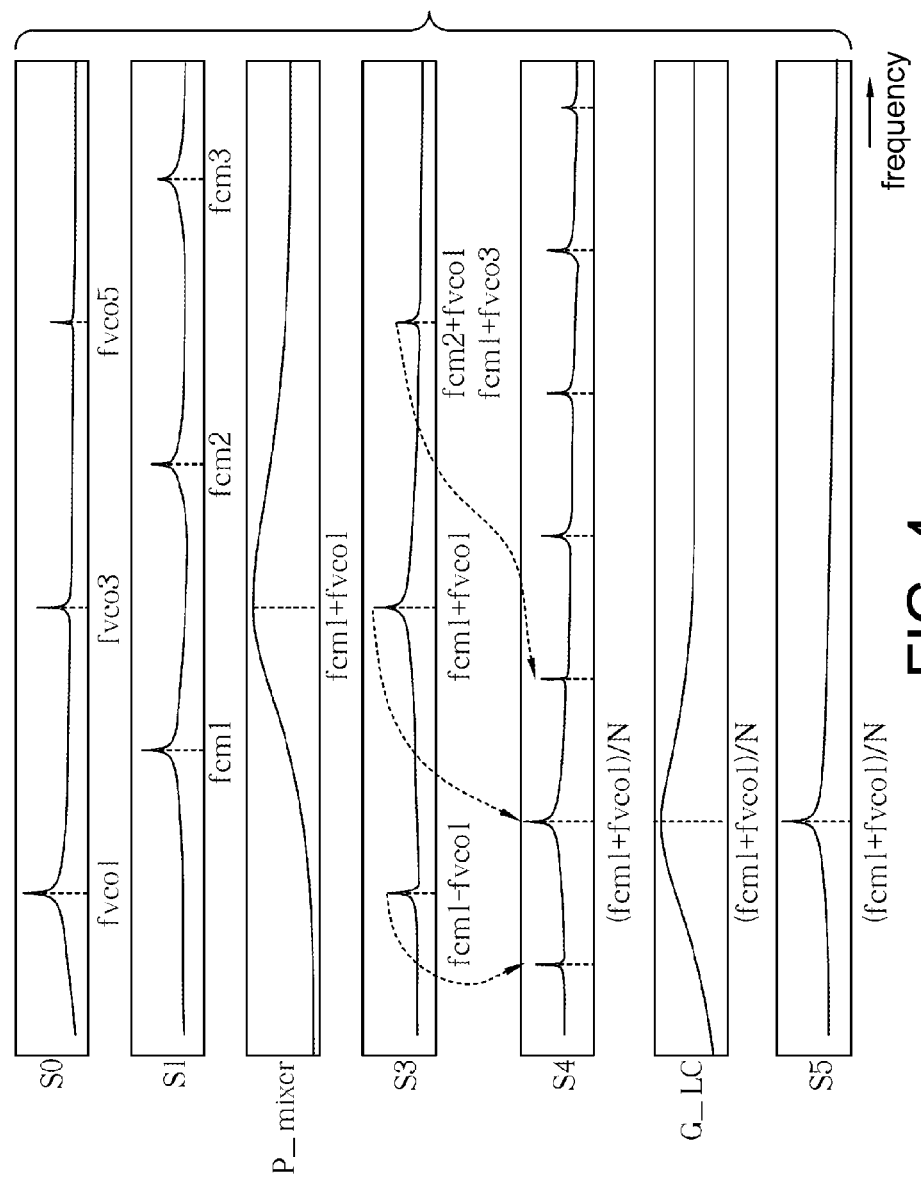
FIG. 4 is an exemplary spectrum diagram of associated signals in FIG. 2.

FIG. 3 shows a time-domain waveform diagram of associated signals in FIG. 2 according to an embodiment, with the horizontal axis representing the time, and the vertical axis representing the amplitude of the waveform. FIG. 4 shows a spectrum diagram of associated signals in FIG. 2, with the horizontal axis representing the frequency, and the vertical axis representing the amplitude of the spectrum. FIG. 4 also depicts a frequency-domain output resonance P_mixer of the mixer 38, and a frequency gain resonance G_LC of the mixer 42 according to an embodiment of the present invention.

Referring to FIG. 4, corresponding to the frequency Fvco of the oscillator 28, the signal S0 includes odd harmonics in frequencies fvco1, fvco3, and fvco5, which respectively equal to frequencies Fvco, 3*Fvco, and 5*Fvco, and so forth. The harmonic in the frequency fvco1 is the dominant harmonic, having an amplitude and power greater than those of other odd harmonics. That is, the signal S0 is mostly associated with the frequency fvco1=Fvco. The signal S1 may include common mode harmonics in frequencies fcm1, fcm2, and fcm3, i.e., even multiple harmonics of the frequency Fvco. The frequencies fcm1, fcm2, and fcm3 are respectively equal to frequencies 2*Fvco, 4*Fvco, and 6*Fvco, and so forth. The harmonic in the frequency fcm1 may be a dominant harmonic having an amplitude and power greater than those of other odd harmonics. Thus, the integer M in FIG. 2 may be 2, such that the signal S1 is mostly associated with the frequency fcm1=M*Fvco=2*Fvco. As shown in FIG. 3, a repetition cycle of the waveform of the signal S2 is half of that of the signal S0.

The signals S0 and S1 are mixed to a signal S3 by the mixer 38 (in FIG. 2). In an embodiment, the mixer 38 is a double side-band mixer. Hence, the signal S3 includes components in frequencies (fcm1−fvco1), (fcm1+fvco1), (fcm1+fvco3), and (fcm2+fvco2). In an embodiment, the mixer 40 supports band-pass filtering, and has a pass band associated with the frequency (fcm1+fvco1), e.g., regarding the frequency (fcm1+fvco1) as a center, as indicated by the resonance P_mixer. Thus, in the signal S3, the frequency (fcm1+fvco1) is the main component, whereas components in other frequencies are suppressed by band-pass filtering performed by the mixer 40. Therefore, the signal S3 is associated with the frequency (fcm1+fvco1)=(M+1)*Fvco. Referring to FIG. 3, since the integer M is equal to 2, a repetition cycle of every three waveforms in the signal S3 corresponds to one cycle in the signal S0, signifying that the frequency f3 of the signal S3 is three times of the frequency Fvco. The mixer 38 may also be a single side-band mixer, which keeps components in the frequency (fcm1+fvco1) when mixing the frequencies fcm1 and fvco1 to suppress components in the frequency (fcm1−fvco1); that is, to keep a higher side-band and suppress a lower side-band.

The frequency divider 40a frequency divides the signal S3 by an integer N to generate a signal S4. The main component in the frequency (fcm1+fvco1) in the signal S3 are frequency divided to a frequency (fcm1+fvco1)/N, such that the signal S4 is associated with a frequency (fcm1+fvco1)/N=((1+M)/N)*Fvco. Further, secondary components in other frequencies in the signal S3 are also frequency divided and are present in the signal S4. However, since the pass-band of the filter 40a is targeted at the frequency (fcm1+fvco1)/N, the other secondary components in the signal S4 are suppressed after the frequency filter 40a filters the signal S4 into a signal S5, leaving only the main component in the frequency (fcm1+fvco1)/N in the signal S5. According to the signal S5, the local oscillation generator 32 provides the signal SC as the local oscillation signal.

In an embodiment, the local oscillation generator 32 in FIG. 2 provides a 2.4 GHz local oscillation signal SC, the operating frequency Fvco of the oscillator 28 is 3.2 GHz, the frequency f1 is a two-fold frequency 6.4 GHz (i.e., M=2), and the frequency f3 after mixing is 9.6 GHz. Through frequency dividing by the integers N and N2 (N=N2=2), a 2.4 GHz signal SC can be generated. Although multi-frequency interference harmonics in 4.8 GHz and/or 7.2 GHz are derived from the 2.4 GHz local oscillation frequency due to the non-linearity in the communication system 10, the frequencies of the multi-frequency interference harmonics can be avoided since the oscillator 28 operates at the 3.2 GHz frequency Fvco.

Further, in the local oscillation generator 32, positions of the frequency dividers 40a and 40b and the filter 42 can be exchanged. In an embodiment, band-pass filter may be first performed on the signal S3 of mixer 38 by the filter 42 (having a pass band associated with the frequency f3), and the local oscillation signal SC is then generated after frequency dividing performed by the frequency dividers 40a and 40b.

Figure 5:
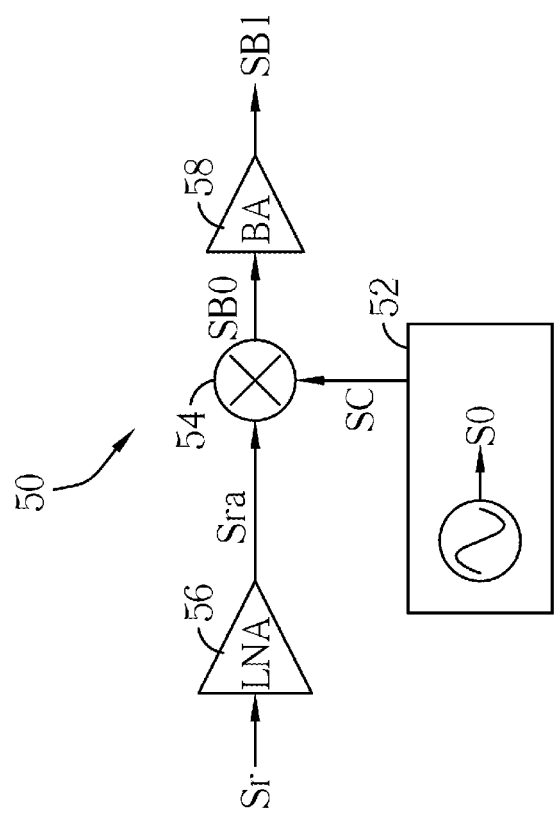
FIG. 5 is a schematic diagram of a receiver according to an embodiment of the present invention.

FIG. 5 shows a schematic diagram of a communication system 50 according to an embodiment of the present invention. The communication system 50 includes a local oscillation generator 52, a low-noise amplifier 56, a mixer 54, and a baseband amplifier 58, configured to implement a receiver in a wireless communication network. The local oscillation generator 52 may be the local oscillation generator 12 or 32 in FIG. 1 or FIG. 2, and provides a signal SC as a local oscillation signal according to a fundamental oscillation signal S0. When receiving an RF signal, the low-noise amplifier 56 amplifies an RF signal Sr to generate an amplified RF signal Sra. The mixer 54 is coupled to the local oscillation generator 52 and the low-noise amplifier 56, and mixes the amplified RF signal Sra and the local oscillation signal SC to accordingly provide a baseband signal SB0. The baseband amplifier 58 is coupled to the third mixer 54, and amplifies the baseband signal SB0 to provide an amplified baseband signal SB1.

Figure 6:
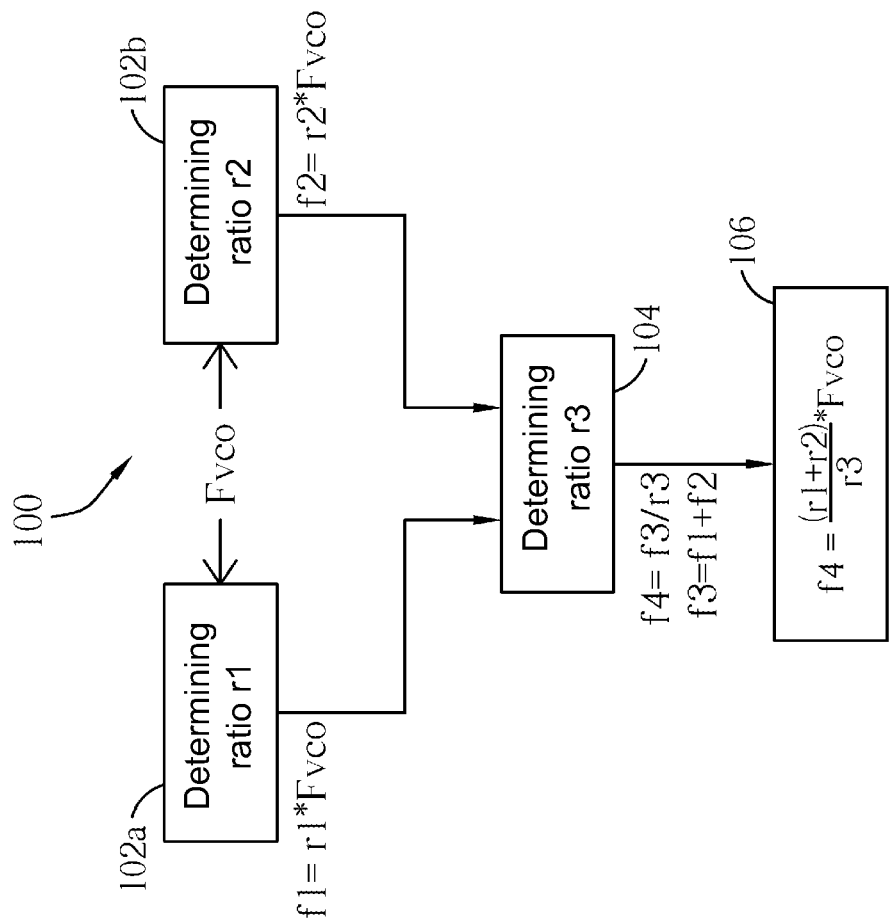
FIG. 6 is a schematic diagram of a process according to an embodiment of the present invention.

FIG. 6 shows a schematic diagram of a process 100 according to an embodiment of the present invention. The process 100 is applicable to a communication system such as the communication system in FIGS. 1, 2, and 5 to provide a local oscillation signal. The process 100 includes the following steps.

In step 102a, a ratio r1 between a frequency f1 and a fundamental frequency Fvco is determined. The fundamental frequency Fvco is associated with a fundamental oscillation signal S0; the frequency f1 is associated with an oscillation signal S1. The oscillation signal S1 may be generated by multiplying the frequency of the fundamental oscillation signal S0.

In step 102b, a ratio r2 between a frequency f2 and the fundamental frequency Fvco is determined. The frequency f2 is associated with an oscillation signal S2. In an embodiment, the oscillation signal S2 is equal to the fundamental oscillation signal S0, as shown in the embodiment in FIG. 2, such that the ratio r2 is equal to 1. In an alternative embodiment, the oscillation signal may be generated by frequency multiplying the fundamental oscillation signal S0, as shown in the embodiment in FIG. 1, such that the ratio r2 is not equal to 1.

In step 104, a mixed oscillation signal S3 is generated according to the oscillation signals S1 and S2, such that a mixer frequency f3 of the mixed oscillation signal S3 is a sum of the frequencies f1 and f2. A ratio r3 of the mixer frequency S3 to a divider frequency S4 is determined, and the mixed oscillation signal S3 is frequency divided according to the ratio r3 to generate a frequency divided signal S4. The divider frequency f4 is associated with a frequency of the frequency divided signal S4.

In step 106, a relationship between the divider frequency f4 and the fundamental frequency Fvco is determined according to the ratios r1, r2, and r3. The local oscillation signal SC is then provided according to the frequency divided signal S4.

In an embodiment, the ratios r, r2, and r3 are integers, and the ratio r3 is a non-integral multiple of a sum of the ratios r1 and r2, such that the fundamental frequency Fvco is a non-integral multiple of the divider frequency f4.

In an embodiment, a reciprocal of the ratio r1, the ratio r2, and the ratio r3 are integers, and the ratio r3 is a non-integral multiple of a sum of the ratios r1 and r2, such that the fundamental frequency Fvco is a non-integral multiple of the divider frequency f4.

In an embodiment, the ratio r1, a reciprocal of the ratio r2, and the ratio r3 are integers, and the ratio r3 is a non-integral multiple of a sum of the ratios r1 and r2, such that the fundamental frequency Fvco is a non-integral multiple of the divider frequency f4.

In an embodiment, reciprocals of the ratios r1 and r2, and the ratio r3 are integers, and the ratio r3 is a non-integral multiple of a sum of the ratios r1 and r2, such that the fundamental frequency Fvco is a non-integral multiple of the divider frequency f4.

In conclusion, compared to the conventional technique, the local oscillation generation technique of the present invention renders a fundamental frequency of an oscillator/oscillation circuit to be a non-integral multiple of a local oscillation frequency, so that interferences imposed by a communication system on the oscillator/oscillation circuit are effectively suppressed to enhance communication quality.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A local oscillation generator, applied to a communication system, for providing a local oscillation signal, the local oscillation generator comprising:
an oscillation circuit, configured to provide a fundamental oscillation signal with a fundamental frequency;
a frequency multiplication circuit, coupled to the oscillation circuit, configured to multiply the fundamental oscillation signal to generate a first oscillation signal with a first frequency;
a mixer, coupled to the oscillation circuit and the frequency multiplication circuit, said mixer receiving the fundamental oscillation signal and the first oscillation signal, and configured to provide a mixed oscillation signal with a mixer frequency according to the fundamental oscillation signal and the first oscillation signal; and
a frequency divider, coupled to the mixer, configured for frequency-dividing the mixed oscillation signal to provide a frequency-divided signal with a divider frequency.

2. The local oscillation generator according to claim 1, wherein the local oscillation signal is derived from the frequency-divided signal, and the fundamental frequency is a non-integral multiple of a local oscillation frequency of the local oscillation signal that mitigates interference to said oscillation circuit caused by multi-frequency harmonics of a power amplifier downstream from said frequency divider.

3. The local oscillation generator according to claim 2, wherein the oscillation circuit and the frequency multiplication circuit are integrated in an oscillator, the fundamental oscillation signal is provided by differential nodes of the oscillator, and the first oscillation signal is provided by a common mode node of the oscillator.

4. The local oscillation generator according to claim 2, wherein the first frequency is a first integer M multiple of the fundamental frequency, the mixer frequency is a second integer N multiple of the divider frequency, and the second integer N is a non-integral multiple of a sum of the first integer M and 1.

5. The local oscillation generator according to claim 1, further comprising:
a second frequency multiplication circuit, coupled between the oscillation circuit and the mixer, configured to multiply the fundamental oscillation signal to generate a second oscillation signal with a second frequency.

6. The local oscillation generator according to claim 5, wherein the first frequency is a first integer M multiple of the fundamental frequency, the second frequency is a second integer L multiple of the fundamental frequency, the mixer frequency is a third integer N multiple of the divider frequency, and the third integer N is a non-integral multiple of a sum of the first integer M and the second integer L.

7. The local oscillation generator according to claim 5, wherein the fundamental frequency is a first integer M multiple of the first frequency, the second frequency is a second integer L multiple of the fundamental frequency, the mixer frequency is a third integer N multiple of the divider frequency, and the third integer N is a non-integral multiple of a sum of a reciprocal 1/M of the first integer M and the second integer L.

8. The local oscillation generator according to claim 5, wherein the first frequency is a first integer M multiple of the fundamental frequency, the fundamental frequency is a second integer L multiple of the second frequency, the mixer frequency is a third integer N multiple of the divider frequency, and the third integer N is a non-integral multiple of a sum of the first integer M and a reciprocal 1/L of the second integer L.

9. The local oscillation generator according to claim 5, wherein the fundamental frequency is a first integer M multiple of the first frequency, the fundamental frequency is a second integer L multiple of the second frequency, the mixer frequency is a third integer N multiple of the divider frequency, and the third integer N is a non-integral multiple of a sum of a reciprocal 1/M of the first integer M and a reciprocal 1/L of the second integer L.

10. The local oscillation generator according to claim 1, further comprising:
a filter with a pass band, coupled to the frequency divider, for performing band-pass filtering on the frequency-divided signal,
wherein, said pass band is associated with a frequency of the local oscillation signal.

11. The local oscillation generator according to claim 1, wherein the mixer supports a band-pass filter function having a pass band associated with the mixer frequency.

12. A communication system, comprising a local oscillation generator for providing a local oscillation signal, the local oscillation generator comprising:
an oscillation circuit, configured to provide a fundamental oscillation signal with a fundamental frequency;
a frequency multiplication circuit, coupled to the oscillation circuit, configured to multiply the fundamental oscillation signal to generate a first oscillation signal with a first frequency;
a mixer, coupled to the oscillation circuit and the frequency multiplication circuit, receiving the fundamental oscillation signal and the first oscillation signal, said mixer configured to provide a mixed oscillation signal with a mixer frequency according to the fundamental oscillation signal and the first oscillation signal; and
a frequency divider, coupled to the mixer, configured for frequency-dividing the mixed oscillation signal to provide a frequency-divided signal with a divider frequency.

13. The communication system according to claim 12, further comprising a transmitter, to which the local oscillation generator is applied; wherein the local oscillation signal is derived from the frequency-divided signal, and the fundamental frequency is a non-integral multiple of a local oscillation frequency of the local oscillation signal that mitigates interference to said oscillation circuit caused by multi-frequency harmonics of a power amplifier of said transmitter.

14. The communication system according to claim 13, wherein the first frequency is a first integer M multiple of the fundamental frequency, the mixer frequency is a second integer N multiple of the divider frequency, and the second integer N is a non-integral multiple of a sum of the first integer M and 1.

15. The communication system according to claim 13, further comprising:
a second frequency multiplication circuit, coupled between the oscillation circuit and the mixer, configured to multiply the fundamental oscillation signal to generate a second oscillation signal with a second frequency.

16. The communication system according to claim 13, wherein the first frequency is a first integer M multiple of the fundamental frequency, the second frequency is a second integer N multiple of the fundamental frequency, the mixer frequency is a third integer L multiple of the divider frequency, and the third integer L is a non-integral multiple of a sum of the first integer M and the second integer N.

17. The communication system according to claim 13, wherein the fundamental frequency is a first integer M multiple of the first frequency, the second frequency is a second integer N multiple of the fundamental frequency, the mixer frequency is a third integer L multiple of the divider frequency, and the third integer L is a non-integral multiple of a sum of a reciprocal 1/M of the first integer M and the second integer N.

18. The communication system according to claim 13, wherein the first frequency is a first integer M multiple of the fundamental frequency, the fundamental frequency is a second integer N multiple of the second frequency, the mixer frequency is a third integer L multiple of the divider frequency, and the third integer L is a non-integral multiple of a sum of the first integer M and a reciprocal 1/N of the second integer N.

19. The communication system according to claim 13, wherein the fundamental frequency is a first integer M multiple of the first frequency, the fundamental frequency is a second integer N multiple of the second frequency, the mixer frequency is a third integer L multiple of the divider frequency, and the third integer L is a non-integral multiple of a sum of a reciprocal 1/M of the first integer M and a reciprocal 1/N of the second integer N.

20. The communication system according to claim 13, wherein the transmitter further comprises:
a second mixer, coupled to the local oscillation generator, for mixing a baseband signal and the local oscillation signal to accordingly provide a radio-frequency (RF) signal; and
wherein said power amplifier is coupled to the second mixer, for amplifying the RF signal.

21. The communication system according to claim 12, further comprising a receiver, wherein said receiver receives said local oscillation signal from the local oscillation generator.

22. The communication system according to claim 21, wherein the receiver further comprises:
a low-noise amplifier, configured to amplify an RF signal to generate an amplified RF signal;
a third mixer, coupled to the local oscillation generator, for mixing the amplified RF signal and the local oscillation signal to accordingly provide a baseband signal; and
a baseband amplifier, coupled to the third mixer, for amplifying the baseband signal.

23. A method for local oscillation generation, applied to a communication system, for providing a local oscillation signal, the method comprising:

- determining a first ratio of a first frequency of a first oscillation signal to a fundamental frequency of a fundamental oscillation signal; wherein the first oscillation signal is generated by frequency-multiplying the fundamental oscillation signal;
- determining a second ratio of a second frequency of a second oscillation signal to the fundamental frequency; wherein the second oscillation signal is associated with the fundamental oscillation signal;
- determining a third ratio of a mixer frequency of a mixed oscillation signal to a divider frequency of a frequency-divided signal; wherein the mixed oscillation signal is generated according to the first oscillation signal and the second oscillation signal, and the frequency-divided signal is generated by frequency-dividing the mixed oscillation signal; and
- determining a relationship between the divider frequency and the fundamental frequency according to the first ratio, the second ratio and the third ratio.

24. The method for local oscillation generation according to claim 23, wherein the second oscillation signal is equal to the fundamental oscillation signal, the mixed oscillation signal is generated by mixing the fundamental oscillation signal and the first oscillation signal, the first ratio, the second ratio and the third ratio are integers, and the third ratio is a non-integral multiple of a sum of the first ratio and the second ratio such that the fundamental frequency is a non-integral multiple of the divider frequency.

25. The method for local oscillation generation according to claim 23, wherein the second oscillation signal is equal to the fundamental oscillation signal, the mixed oscillation signal is generated by mixing the fundamental oscillation signal and the first oscillation signal, a reciprocal of the first ratio, the second ratio and the third ratio are integers, and the third ratio is a non-integral multiple of a sum of the first ratio and the second ratio such that the fundamental frequency is a non-integral multiple of the divider frequency.

26. The method for local oscillation generation according to claim 23, wherein the second oscillation signal is generated by frequency-multiplying the fundamental oscillation signal, and the mixed oscillation signal is generated by mixing the second oscillation signal and the first oscillation signal.

27. The method for local oscillation generation according to claim 26, wherein the first ratio, the second ratio and the third ratio are integers, and the third ratio is a non-integral multiple of a sum of the first ratio and the second ratio such that the fundamental frequency is a non-integral multiple of the divider frequency.

28. The method for local oscillation generation according to claim 26, wherein a reciprocal of the first ratio, the second ratio and the third ratio are integers, and the third ratio is a non-integral multiple of a sum of the first ratio and the second ratio such that the fundamental frequency is a non-integral multiple of the divider frequency.

29. The method for local oscillation generation according to claim 26, wherein the first ratio, a reciprocal of the second ratio and the third ratio are integers, and the third ratio is a non-integral multiple of a sum of the first ratio and the second ratio such that the fundamental frequency is a non-integral multiple of the divider frequency.

30. The method for local oscillation generation according to claim 26, wherein a reciprocal of the first ratio, a reciprocal of the second ratio and the third ratio are integers, and the third ratio is a non-integral multiple of a sum of the first ratio and the second ratio such that the fundamental frequency is a non-integral multiple of the divider frequency.

* * * * *